US006262361B1

(12) United States Patent
Konz

(10) Patent No.: US 6,262,361 B1
(45) Date of Patent: *Jul. 17, 2001

(54) DEVICE FOR ABSORBING ELECTRICAL NOISE

(75) Inventor: Oliver Konz, Ilshofen (DE)

(73) Assignee: Wurth Elektronik GmbH & Co. KG, Niedernhall (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/043,786

(22) PCT Filed: Sep. 24, 1996

(86) PCT No.: PCT/EP96/04159

§ 371 Date: Mar. 27, 1998

§ 102(e) Date: Mar. 27, 1998

(87) PCT Pub. No.: WO97/13321

PCT Pub. Date: Apr. 10, 1997

(30) Foreign Application Priority Data

Sep. 29, 1995 (DE) .............................................. 195 36 155

(51) Int. Cl.[7] ....................................................... H05K 9/00

(52) U.S. Cl. .......................... 174/35 R; 333/12; 333/185; 336/92; 336/175; 336/176

(58) Field of Search ............................ 174/35 R; 333/12, 333/185; 336/92, 175, 176

(56) References Cited

U.S. PATENT DOCUMENTS

| | | | | |
|---|---|---|---|---|
| 3,462,715 | | 8/1969 | Schor | 333/79 |
| 4,970,476 | * | 11/1990 | Kitagawa | 333/12 |
| 4,972,167 | * | 11/1990 | Fujioka | 336/92 |
| 4,983,932 | * | 1/1991 | Kitagawa | 333/12 |

FOREIGN PATENT DOCUMENTS

| | | |
|---|---|---|
| 3932021 A1 | 4/1990 | (DE) . |
| 4004211 A1 | 8/1990 | (DE) . |
| 4104100 A1 | 9/1991 | (DE) . |
| 4137859 A1 | 5/1992 | (DE) . |
| 4302650 A1 | 8/1993 | (DE) . |
| 94 08 883 | 9/1994 | (DE) . |
| 3932021 C2 | 7/1995 | (DE) . |
| 0452992A2 | 10/1991 | (EP) . |

* cited by examiner

*Primary Examiner*—William A. Cuchlinski, Jr.
*Assistant Examiner*—Ronnie Mancho
(74) *Attorney, Agent, or Firm*—Quarles & Brady LLP

(57) ABSTRACT

A device for absorbing electrical noise in a cable contains two ferrite cores, each of which is housed in a casing half-shell. The two casing half-shells are placed with the ferrite cores around a cable such that a cylindrical passage is formed. The casing half-shells include semicylindrical webs, which fit into grooves in the ferrite cores. The casing half-shells have a tongue on one of the half-shells and a ratchet member on another of the half-shells to provide an adjustable closure to accommodate variance in the dimensions of the ferrite cores.

10 Claims, 4 Drawing Sheets

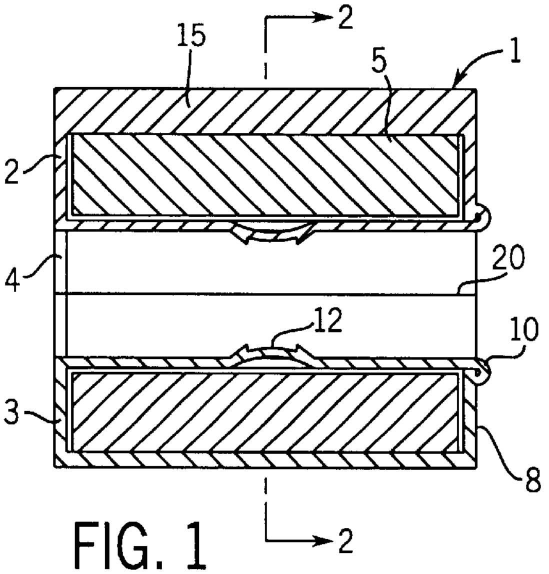
FIG. 1
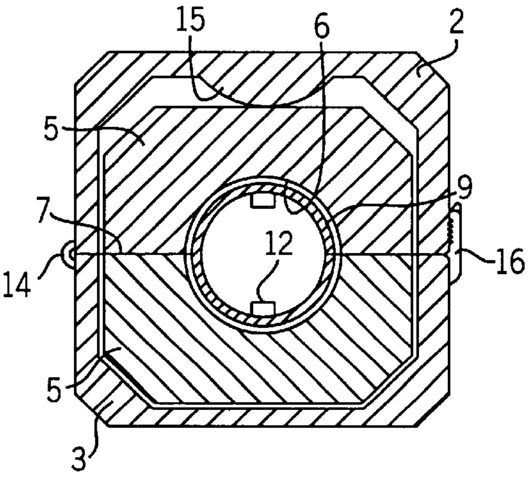
FIG. 2
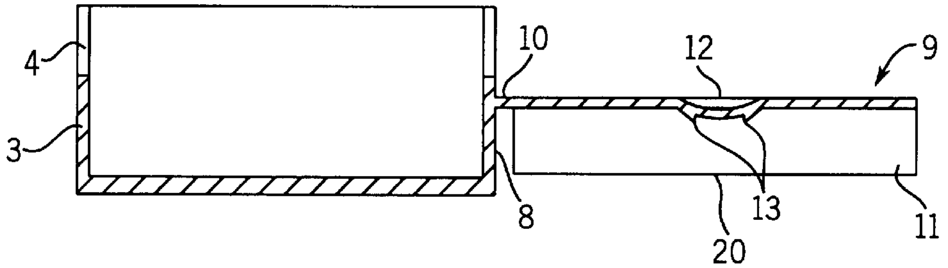
FIG. 3
FIG. 4
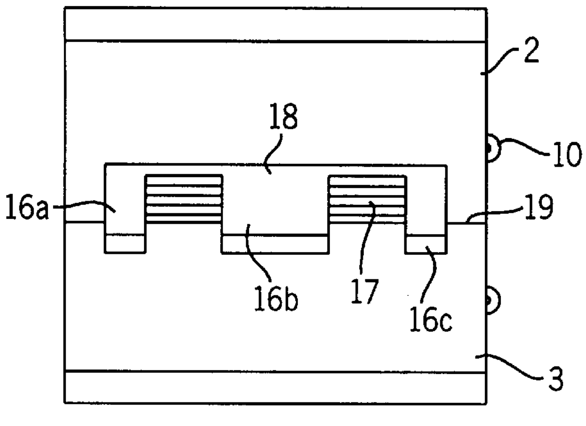

FIG. 8
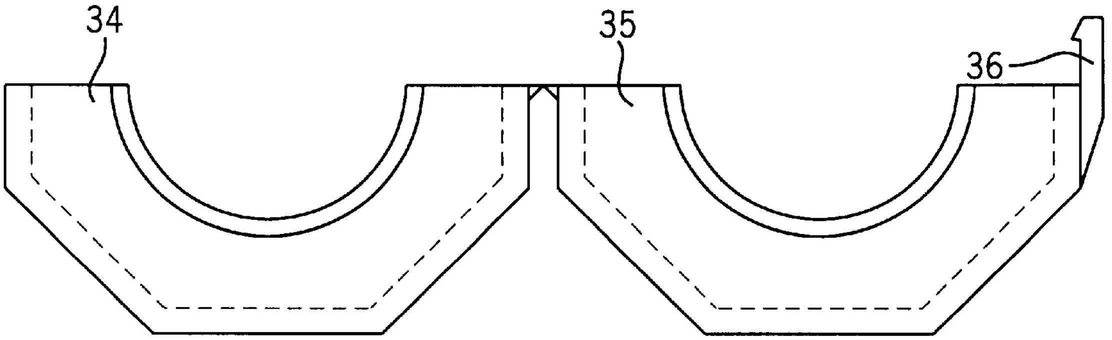
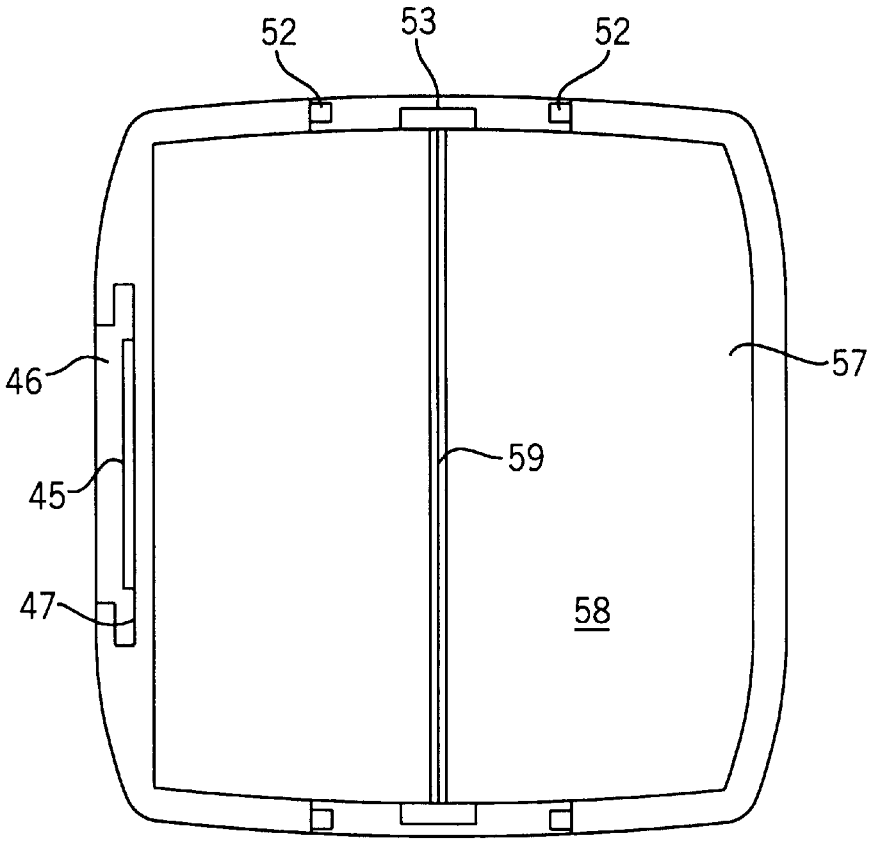
FIG. 12

DEVICE FOR ABSORBING ELECTRICAL NOISE

TECHNICAL FIELD

The invention relates to a device for absorbing electrical noise with the aid of elements made from a noise absorbing or noise preventing material placed around an electrical cable.

DESCRIPTION OF THE BACKGROUND ART

It has long been known that with the aid of ferromagnetic elements it is possible to reduce electrical noise on the line. See U.S. Pat. No. 3,462,715, for example.

It is also known to make such ferromagnetic material elements in split form, so that they can be subsequently fitted to a cable. The two parts must be in contact so that the action is effective.

This can be brought about as disclosed in EP Published App. No. 0452992 A2 by placing the two half-elements in a casing, whose bases have elastic pretensioning means pressing the two magnetic elements onto one another.

The problem to be solved by the invention is to provide a device for absorbing electrical noise, which has a simple construction and in which the insertion of the elements of a noise absorbing or noise preventing material is easy.

SUMMARY OF THE INVENTION

In the device of the present invention, two casing half-shells with the noise preventing or absorbing material elements located therein are fitted to an electrical cable in which noise is to be reduced. This can take place by folding together or assembling the two casing half-shells.

If the two elements are subsequently inserted in the previously manufactured casing half-shells, fitting takes place in such a way that initially the two elements made from the material are inserted in the two casing half-shells and each is subsequently secured by a respective web. The web thereby traverses the present semicylindrical groove of the ferromagnetic element. As a result, the two casing half-shells can be assembled around the electrical cable.

The interconnection of the two casing half-shells can take place by means of snap-on devices or in any other way, by an adhesive tape, wire or the like placed around the outside of the casing.

In particular, in a further development, for locking the casing one casing half-shell is provided with a tongue having a tooth system and which cooperates with a tooth system on the other half-shell. As a result of the fine tooth system the casing can be locked in finely graduated positions, so that it is possible to compensate for tolerances in the manufacture of the ferromagnetic elements.

It is possible to fit such tongues and tooth systems to both longitudinal sides or both end faces. The tongues can in particular be so positioned that they also bring about a reciprocal alignment of the two casing half-shells.

The tooth systems are so chosen that they have a sawtooth configuration, to prevent unintentional release.

It is also possible to interconnect the two casing half-shells by a film hinge on each longitudinal side thereof, so that they can then be folded from the open into the closed state an open position to a closed position. Here again, a tongue and tooth system is possible for locking the half-shells.

For angular alignment of one of the two ferromagnetic elements, a rigid and, in particular, rounded projection, which preferably extends over the entire casing length. The outside of the ferrite element then rests on the projection and can then tilt within certain limits about its longitudinal axis.

According to a further development of the invention the web, which is used for fixing the ferrite elements, can be in the form of a semicylinder, so that in the assembled state the webs in the two half-shells form a closed cylinder, which completely covers the inside of the semicylindrical grooves of the ferrite elements. In the closed state the longitudinal edges of the two semicylinder webs engage on one another and consequently hold the webs in position.

For fixing the device to the electrical cable, according to the invention at least one of the webs forming the fixing device can have an inwardly directed projection for fixing the cable. This projection can have an elastic construction. It is also possible for the two webs, particularly the two semicylinders, to have such a projection, which is preferably centrally positioned.

According to a further development of the invention the webs can be laterally insertable into the casing half-shells. It is also possible and is proposed that the web is connected by means of a film hinge to one end of a casing half-shell.

Further features, details and advantages can be understood from the following description of a preferred embodiment of the invention in which reference is made to the drawings, which form a part hereof and which show:

BRIEF DESCRIPTION OF THE DRAWINGS

FIG. 1 A longitudinal section view through a device according to the invention in the assembled state.

FIG. 2 A cross-section through the arrangement of FIG. 1 taken in the plane indicated by line 2—2 in FIG. 1.

FIG. 3 A detail view of the lower portion of FIG. 1 with a casing half-shell in the unfolded state.

FIG. 4 A side view in elevation of the device corresponding to FIG. 1.

FIG. 8 A front view in elevation of a third embodiment of the invention before the noise absorbing elements are inserted.

FIG. 12 A top plan view of a half-shell in a sixth embodiment.

DETAILED DESCRIPTION OF THE PREFERRED EMBODIMENTS

Figure 5:
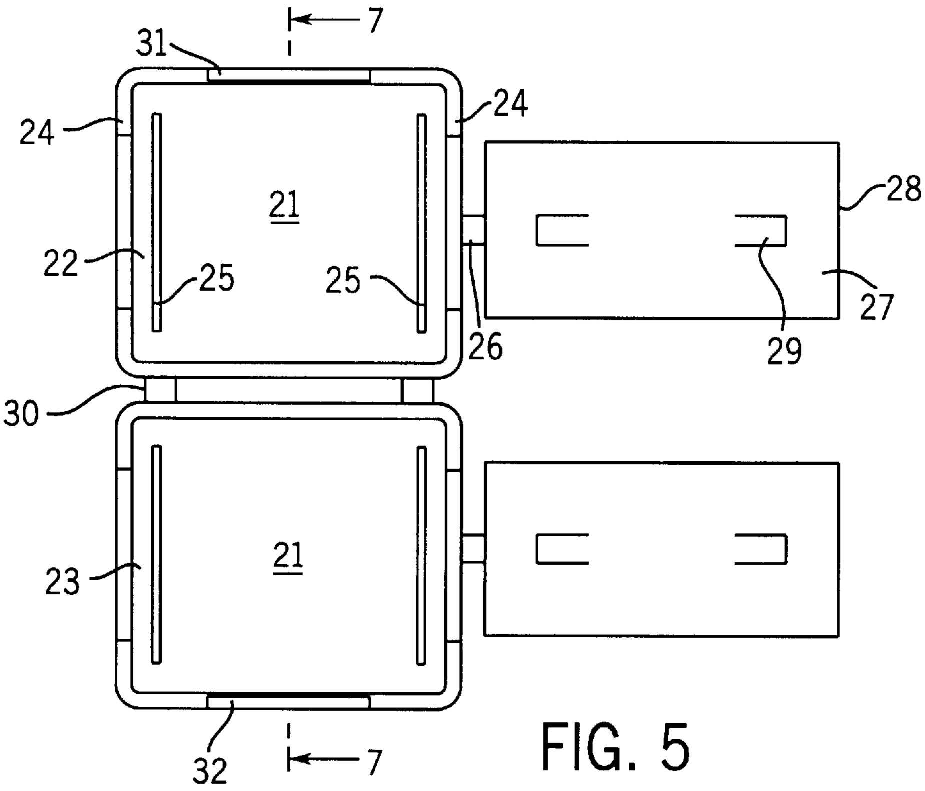
FIG. 5 A plan view of a second embodiment of the invention before the noise absorbing elements are inserted.

FIG. 1 shows the device proposed by the invention in the ready-to-operate state, the electrical cable in which the electrical noise is to be suppressed being omitted from the drawings for a better view of the device. The device contains a casing 1 formed from two casing half-shells 2, 3. The two casing half-shells 2, 3 are so joined together that their open sides rest on one another. As a result the assembled casing has an opening 7 therethrough extending between its two end faces, which are aligned. A ferromagnetic element 5 is disposed in each casing half-shell 2, 3, the ferromagnetic element having roughly the same length as the interior of the casing half-shell 2. The ferromagnetic element 5, hereinafter referred to as ferrite element, has on its one side a semicylindrical groove 6 extending over the length of the ferrite element 5. In the assembled state according to FIGS. 1 and 2, the two ferrite elements 5 face one another in such a way that the two semicylindrical grooves 6 together form a cylindrical passage. The ferrite elements 5 further include two adjacent separating faces 7 which rest on one another. As a result, a closed ferrite body is formed around the passage and through it passes the electrical cable.

Referring now to FIG. 3, a web 9 is attached to each of the two end faces 8 by a film hinge 10. The web 9 is in the form of a circular semicylinder or expressed otherwise as a half-tube 11. Roughly in the center of the longitudinal extension, a resilient projection 12 is formed in the web 9, where it projects into the channel formed by the half-tube 11 and is provided with two individual, small prongs 13.

The second casing half-shell 2, which in FIG. 3 is to be considered behind the visible casing half-shell 3, is also articulated with the aid of a film hinge 14 onto the casing half-shell 3 and also this second casing half-shell 2 has a web 9 articulated by means of a film hinge 10.

In the two open half-shells 2, 3 in the position shown in FIG. 3 are inserted the ferrite elements 5, namely one ferrite element 6 in each half-shell, the grooves 6 being located at the top, and towards the open side of the half-shells 2, 3. The base of one of the two half-shells 2 contains a rounded projection 15 running in the longitudinal direction of the casing, as seen above in FIG. 2, on which rests the corresponding ferrite element 5. Through a certain amount of rolling on the crest of the projection 15 it can also tilt somewhat. The two locking webs 9 are now folded around until they are located in and lock in the groove 6 of the ferrite elements 5. The casing is then closed by folding together the two half-shells around the film hinge 14. On the longitudinal side of the casing opposite to the film hinge 4, the half shell 3 has a tongue 16, which has on its inside a single tooth or a row of teeth. The tongue 16 is so dimensioned that its inside is roughly flush with the outside of the facing half-shell. This second half-shell, namely the top half-shell in FIG. 2, contains at this point a row of teeth 17, see also FIG. 4. The teeth have a sawtooth configuration, so that it is impossible to detach the tongue 16 without using a tool. On folding together the casing half-shells 2, 3 they are pressed onto one another to such an extent that the two ferrite elements 5 engage on one another at their separating faces 7. In this position the tongue 16 remains locked with respect to the tooth system 17. The tongue 16 has three webs 16*a, b, c*, with which it is shaped onto the casing half-shell 3, its free end then being connected in one piece by a cross out 18. The shaping or articulation of the tongue 16 is immediately alongside the edge 19 of the casing half-shell 3 facing the other casing half-shell 2. This prevents any resilience of the locking system.

If the device proposed by the invention is folded around an electrical cable, then the projections 12 engage on the outside of the cable, so that the overall device is non-positively fixed to the cable.

When the casing is locked on the longitudinal edges 20 of the separate plane of the webs 9 engage flat on one another.

In the illustrated embodiment the two half-shells are articulated together with the aid of a film hinge 14. It would also be possible to construct the two casing half-shells as separate parts and then bring about fixing in such a way that the casing half-shell 3 has a tongue 16 on each of its two longitudinal sides and the other casing half-shell has a corresponding ratchet system 17 with teeth. This would enable a locking of the casing in the closed state.

The embodiment shown in FIGS. 5 to 7 differs slightly from the preceding embodiment and consequently only the differences will be explained.

Two transversely directed webs 25 are joined to the respective casing half-shells 22, 23, a short distance behind respective end walls 24. The two pairs of webs 25 serve to compensate for tolerances during the manufacture of the elements to be inserted in the casing half-shells 22, 23. In this embodiment they replace the projection 15 provided in the embodiment of FIGS. 1 to 4 on the base of one or both half-shells.

Once again on the unilateral end walls 24 of the two half-shells 22, 23 is attached by a film hinge 26 in each case one cross-sectionally roughly U-shaped channel 27. This channel 27 is used for fixing the elements and for this purpose is placed around the film hinge 26, the terminal edge 28 facing the film hinge 26 being locked in the casing.

The base of the channel 27 has two shaped projections 29, which project into the interior of the channel 27 and secure the electrical cable there.

On the longitudinal side remote from the film hinges 30 linking the two casing half-shells 22, 23, one of the half-shells 22 has a tongue 31, which has on its inside a rib or tooth system. Correspondingly the facing side wall of the other casing half-shell 23 has a rib system 32 in sawtooth form, which cooperates with the rib system on the inside of the tongue 31.

Figure 6:
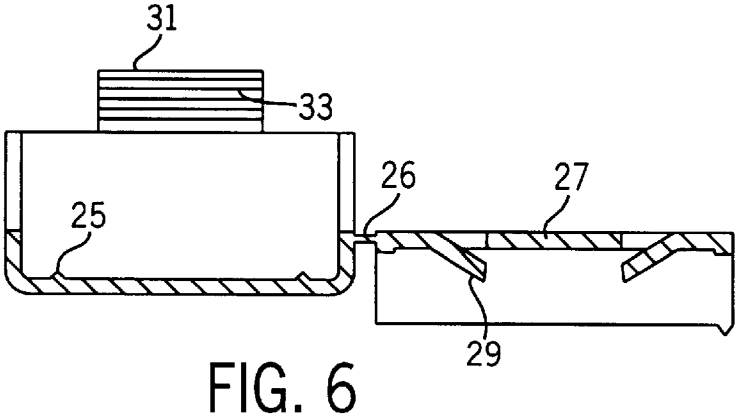
FIG. 6 A sectional view corresponding to the view of FIG. 3, but applied to the embodiment of FIG. 5.
Figure 7:
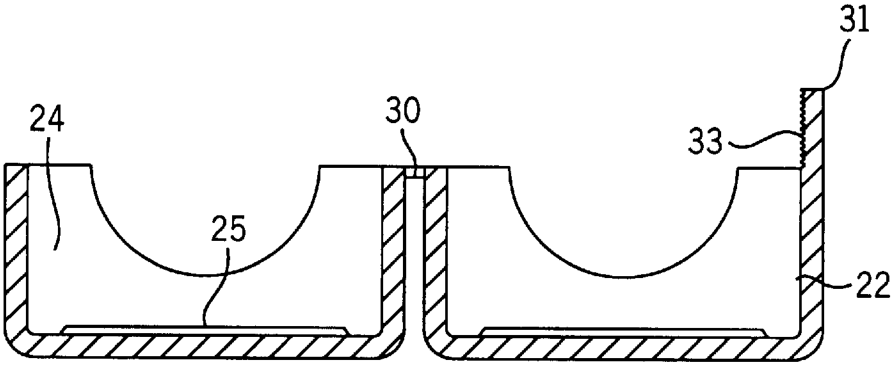
FIG. 7 A cross-section through the arrangement of FIG. 5 taken in plane indicated by line 7—7 therein.

The tooth system 33 on the inside of the tongue 31 can in particular be gathered from FIG. 6, which shows the tongue 31 in side view. The tooth system 33 can also be seen in FIG. 7.

FIG. 8 shows another embodiment, which has a casing comprising two casing half-shells 34, 35. The casing comprising the two half-shells 34, 35 is injection molded around the noise absorbing material elements placed in a mounting support. As a result of the shrinkage occurring with this manufacturing mode, the casing contracts somewhat, so that it adheres in a non-positive manner to the outside of the elements 5. The tolerances which may arise during the manufacture of the ferrite elements are compensated when the casing half-shells are made in this way, so that a simple snap hinge closure 36 is sufficient for fixing purposes. Also in the embodiment according to FIG. 8 the inside of the semicylindrical groove 6 of the elements 5 can be covered by a plastic layer, which is manufactured during injection molding. However, this is optional.

Figure 9:
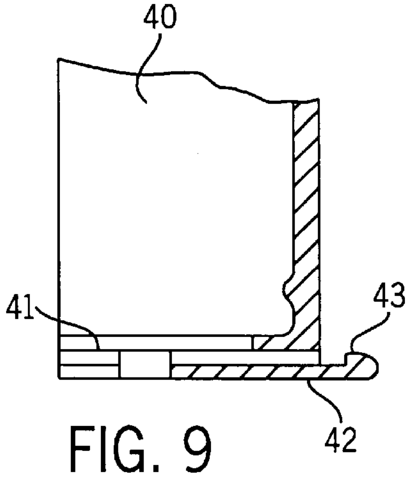
FIG. 9 A detail sectional view of a half-shell in a fourth embodiment.

In the case of the half-shell for housing one element made from the electrical noise preventing or absorbing material shown a somewhat resilient hook 42 is shaped onto a side wall 41 and forms in the area of its free end a barb 43. With this hook 42 the casing 40 can be fixed to a printed circuit board or some other component in that the hook 42 is introduced through an opening or breakthrough. On the opposite side wall, not shown in FIG. 9, is provided a correspondingly shaped, symmetrically arranged hook 42, so that fixing can take place by merely snapping in. The distance between the underside of the base of the half-shell 40 and the barb 43 can be matched to the conventional circuit board thickness.

Figure 10:
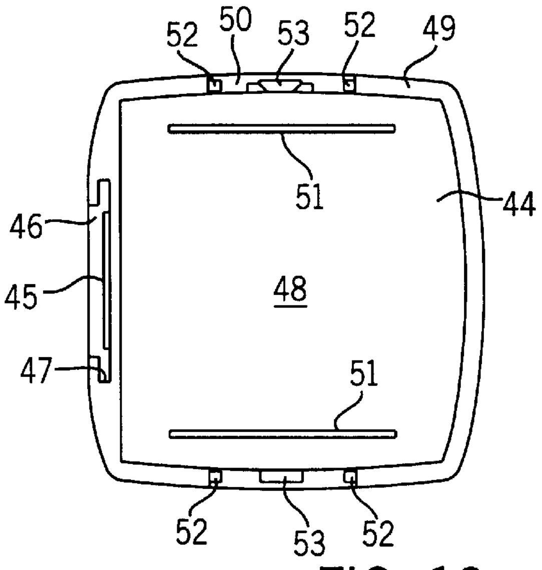
FIG. 10 A plan view of a modified half-shell in a fifth embodiment.
Figure 11:
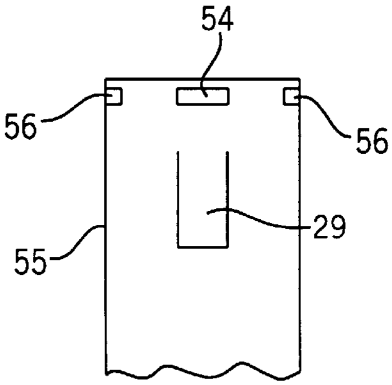
FIG. 11 A top plan view of a web for the half-shell shown in FIG. 10.

FIGS. 10 and 11 show details of another embodiment, in which the locking teeth 45 which are provided for locking the two half-shells 44 are located within a recess of the longitudinal side wall of one half-shell 44. The tongue on the other half-shell can be so shaped that it can engage in the recess 46. The edges of this tongue slide in the laterally constructed grooves 47 of the recess 46. This not only ensures a reliable guidance of the tongue on enclosing the casing, but also prevents an engagement behind the tongue when the casing is closed.

Once again in the end walls 49 of the half-shell 44 are formed semicircular openings 50 for the passage of the cable, to which the half-shells are to be fixed.

The base 48 of the half-shell has two ribs 51 running transversely to the connecting line of the openings 50 and which serve to compensate tolerances of the ferrite cores.

In the semicircular openings 50 of the end walls 49 are provided several projections 52, 53. The central projection 53 can have a type of tongue.

With the projections 52, 53 cooperate the front end of the transverse web 9 according to FIG. 11. FIG. 11 shows such a transverse web 9, which has a similar construction to the web 9 of the embodiment of FIG. 3 in the form of a channel of half-tube. In the area of its front ends it has a breakthrough 54, whose shape and dimensions correspond to the tongue-like projection 53 in the semicircular openings 50 of the half-shell 44.

On both longitudinal edges 55 of the component are made notches 56, which cooperate for locking purposes with the projections 52. The notches 56 need not extend to the planar separating line of the channel-shaped component.

After inserting a ferrite element in the half-shell 44, the web 9 shown in FIG. 11 is inserted in the semicircular openings 50 and guided and fixed there with the aid of the cooperation of the projections 52, 53 and the breakthrough 54, and the notches 56, respectively.

FIG. 12 shows another half-shell 57, which corresponds to the half-shell 44 of the embodiment of FIGS. 10 and 11, but in which the base 58 of the half-shell has a longitudinally directed rib 59, which takes the place of the two ribs 51. The rib 59 has a cross-sectional shape roughly corresponding to the cross-sectional shape of the rib 25 in FIG. 6. Thus, the cross-sectional shape is roughly triangular, optionally with a rounded upper edge.

In all of the illustrated embodiments, the two half-shells with the inserted noise absorbing material cores are folded around a separating plane and closed. The tongue engages to a greater or lesser extent into the tooth system of the other part, as a function of the actual size of the inserted elements. For tolerance reasons they can have somewhat differing dimensions. Thus, in this case the casing could be slightly opened compared with the representation of FIGS. 1, 2 and 4, but it is always ensured that the separating faces 7 of both elements are in tight engagement.

Figure 13:
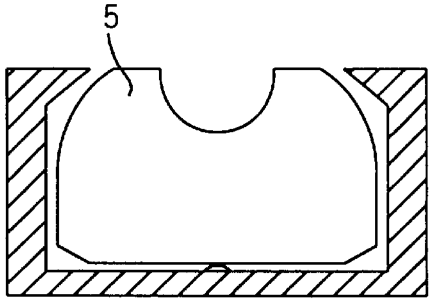
FIG. 13 A simplified transverse sectional view of a seventh embodiment.

In the embodiment shown in simplified form in FIG. 13, the two longitudinal sides of the ferrite core 5, both sides of the half-cylinder inner opening, are in a slightly bulging form, particularly on the side where the casing is open. The casing has on this open side an undercut. In this way the ferrite core 5 can be more easily secured in the casing, which is or particular interest during the storage and handling of the absorber prior to assembly.

Figure 14:
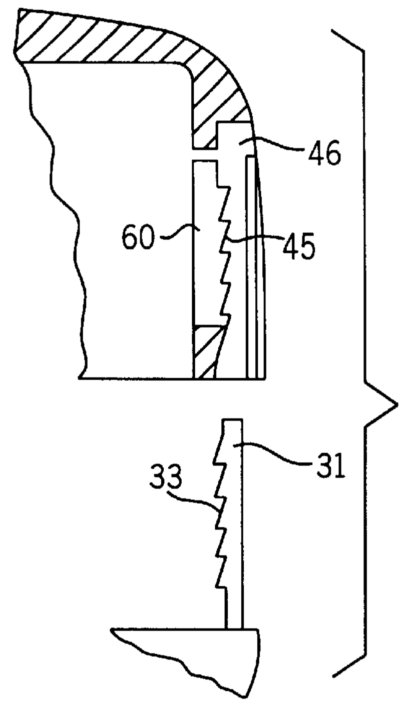
FIG. 14 An enlarged detail sectional view of a locking device between two casing halves.

FIG. 14 shows in a larger scale partial section a locking device, which has a similar construction to the locking device of the embodiment of FIGS. 11 and 12. The locking teeth 45 in the recess 46 are in this case located on the outside of a slightly resilient tongue 60. If the web 31 with the tooth system 33 is inserted in the recess 46, the tongue 60 springs back somewhat and is locked particularly securely with the web 31.

For opening purposes a screwdriver or other tool can be pressed onto the outside of the web 31 and consequently the tongue 60 is somewhat inwardly deformed.

What is claimed is:

1. A device for absorbing electrical noise comprising:

a casing having two casing half-shells of substantially rigid material;

at least two elements of noise absorbing material, each of said two elements of noise absorbing material being substantially rigid and being disposed in a respective one of the two casing half-shells and each of said two elements of noise absorbing material having a respective face and having a semicylindrical groove;

wherein said two casing half-shells each have end faces at opposite ends and in an assembled state form a passage for an electrical cable extending between said end faces; and wherein for securing the casing half-shells together in a closed position, at least one of the two half-shells is provided with a ratchet that is slideable to one of a Plurality of possible closed positions and another of the two half-shells is provided with a tongue having at least one tooth which retains the ratchet as the ratchet slides over the tongue to secure the casing half-shells in one of the plurality of possible closed positions, while adjusting the closed position to accommodate said two elements of noise absorbing material having varying dimensions while holding said respective faces of said two elements of noise absorbing material in abutment.

2. The device according to claim 1, wherein each casing half-shell has a web hinged to one of the end faces and extending between the end faces of the casing and passing through the semicylindrical groove in a respective one of the two elements made from the noise absorbing material.

3. The device according to claim 2, wherein the web is semicylindrical in transverse section.

4. The device according to claim 1, wherein the two casing half-shells are interconnected along one longitudinal side thereof by a film hinge.

5. A device for absorbing electrical noise comprising:

a casing having two casing half-shells;

at least two elements of noise absorbing material, each of said two elements of noise absorbing material being substantially rigid and being disposed in a respective one of the two casing half-shells and each of said two elements of noise absorbing material having a respective face and having a semicylindrical groove;

wherein said two casing half-shells each have end faces at opposite ends and in an assembled state form a passage for an electrical cable extending between said end faces; and wherein for securing the casing half-shells together in a closed position, at least one of the two half-shells is provided with a ratchet and another of the two half-shells is provided with a tongue having at least one tooth which cooperates with the ratchet to secure the casing half-shells in one of a plurality of Possible closed positions, while adjusting the closed position to accommodate said two elements of noise absorbing material having varying dimensions while holding said respective faces of said two elements of noise absorbing material in abutment; and wherein one casing half-shell is shaped with an integrally formed and inwardly directed rounded projection extending longitudinally within the casing half-shell over an entire interior length of the casing half-shell for the alignment of one of the two elements made from the noise absorbing material.

6. A device for absorbing electrical noise comprising:

a casing having two casing half-shells;

at least two elements of noise absorbing material, each of said two elements of noise absorbing material being substantially rigid and being disposed in a respective one of the two casing half-shells and each of said two elements of noise absorbing material having a respective face and having a semicylindrical groove;

wherein said two casing half-shells each have end faces at opposite ends and in an assembled state form a passage for an electrical cable extending between said end faces; and wherein for securing the casing half-shells together in a closed position, at least one of the two half-shells is provided with a ratchet and another of the two half-shells is provided with a tongue having at least one tooth which cooperates with the ratchet to secure the casing half-shells in one of a plurality of possible closed positions, while adjusting the closed position to accommodate said two elements of noise absorbing material having varying dimensions while holding said respective faces of said two elements of noise absorbing material in abutment; and wherein the web has, in the center of its longitudinal extension, an inwardly directed projection for fixing the casing to the electrical cable.

7. A device for absorbing electrical noise comprising:

a casing having two casing half-shells;

at least two elements of noise absorbing material, each of said two elements of noise absorbing material being substantially rigid and being disposed in a respective one of the two casing half-shells and each of said two elements of noise absorbing material having a respective face and having a semicylindrical groove;

wherein said two casing half-shells each have end faces at opposite ends and in an assembled state form a passage for an electrical cable extending between said end faces; and wherein for securing the casing half-shells together in a closed position, at least one of the two half-shells is provided with a ratchet and another of the two half-shells is provided with a tongue having at least one tooth which cooperates with the ratchet to secure the casing half-shells in one of a plurality of possible closed positions, while adjusting the closed position to accommodate said two elements of noise absorbing material having varying dimensions while holding said respective faces of said two elements of noise absorbing material in abutment;

wherein each casing half-shell has a web extending between the end faces of the casing and passing through a semicylindrical groove in a respective one of the two elements made from the noise absorbing material; and wherein each web is connected by a film hinge to one end face of each of the casing half-shells.

8. The device according to claim 7, wherein the web is foldable from an exterior position into each of the casing half-shells.

9. The device according to claim 1, wherein the two casing half-shells are injection molded around the elements of noise absorbing material.

10. The device according to claim 1, wherein said casing half-shells are further comprised of material which is shrinkable to secure of the casing around the two elements of noise absorbing material.

* * * * *